(12) United States Patent
Potlapally et al.

(10) Patent No.: US 9,557,792 B1
(45) Date of Patent: Jan. 31, 2017

(54) DATACENTER POWER MANAGEMENT OPTIMIZATIONS

(71) Applicant: Amazon Technologies, Inc., Reno, NV (US)

(72) Inventors: Nachiketh Rao Potlapally, Arlington, VA (US); James R. Hamilton, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 567 days.

(21) Appl. No.: 13/907,073

(22) Filed: May 31, 2013

(51) Int. Cl.
*G06F 1/28* (2006.01)
*G06F 9/50* (2006.01)

(52) U.S. Cl.
CPC ............... *G06F 1/28* (2013.01); *G06F 9/5088* (2013.01); *G06F 9/5094* (2013.01)

(58) Field of Classification Search
CPC ...... G06F 1/3206; G06F 1/329; G06F 9/5027; G06F 9/5038; G06F 9/5044; G06F 9/5088; G06F 9/5094; G06F 1/206
See application file for complete search history.

(56) References Cited

U.S. PATENT DOCUMENTS

| | | | |
|---|---|---|---|
| 5,189,647 A | 2/1993 | Suzuki et al. | |
| 6,243,794 B1 | 6/2001 | Casamatta | |
| 7,200,735 B2 | 4/2007 | Wang et al. | |
| 7,430,672 B2 | 9/2008 | Rotem et al. | |
| 8,051,310 B2 | 11/2011 | He et al. | |
| 8,140,652 B2 * | 3/2012 | Calo et al. | 709/221 |
| 8,224,639 B2 * | 7/2012 | Inoue | 703/18 |
| 8,255,709 B2 | 8/2012 | Mccarthy et al. | |
| 8,341,441 B2 | 12/2012 | Fletcher | |
| 8,370,661 B2 | 2/2013 | Archer et al. | |
| 8,374,928 B2 | 2/2013 | Gopisetty et al. | |
| 8,631,411 B1 * | 1/2014 | Ghose | 718/102 |
| 2005/0060590 A1 * | 3/2005 | Bradley et al. | 713/320 |
| 2009/0235097 A1 * | 9/2009 | Hamilton et al. | 713/320 |
| 2011/0066727 A1 * | 3/2011 | Palmer | H04L 67/1008 709/224 |
| 2011/0093856 A1 * | 4/2011 | Campbell et al. | 718/102 |
| 2012/0226922 A1 | 9/2012 | Wang et al. | |
| 2013/0017955 A1 | 1/2013 | Hennessy et al. | |
| 2013/0031400 A1 | 1/2013 | Liu et al. | |
| 2013/0054987 A1 | 2/2013 | Pfeiffer et al. | |

OTHER PUBLICATIONS

Victor Zyuban "Unified Architecture Level Energy-Efficiency Metric" GLSVLSI'02 Apr. 18-19, 2002 New York, New York, pp. 1-6.

* cited by examiner

*Primary Examiner* — Kim Huynh
*Assistant Examiner* — Siamak S Hefazi
(74) *Attorney, Agent, or Firm* — Robert C. Kowert; Meyertons, Hood, Kivlin, Kowert & Goetzel, P.C.

(57) ABSTRACT

Methods and apparatus for datacenter power management optimization are disclosed. Metrics, including workload data, thermal measurements and the like are collected from numerous endpoints within a datacenter. System profiles of a plurality of servers, and application workload profiles for various workloads, are stored. Based on analysis of collected metrics, power optimization operations comprising either workload scheduling operations, power configuration change operations, or both, are initiated.

24 Claims, 10 Drawing Sheets

DATACENTER POWER MANAGEMENT OPTIMIZATIONS

BACKGROUND

More and more computing applications are being implemented using large data centers, some of which may contain thousands of servers with different performance and power consumption characteristics. At any given data center, time-varying workloads from hundreds or thousands of clients may be executed, and as a result the resource consumption levels may vary substantially over time. At some points in time, a given subset of the computing resources housed a data center may be heavily used, while at other times, the same resources may be lightly used. Some provider networks may support numerous network-accessible multi-tenant services at dozens or hundreds of data centers distributed around the world, where at least some of the services may rely on utilizing each other's resources, making predictions about resource usage hard.

Power costs (e.g., the costs of electrical power consumed by various computing devices, and by the cooling infrastructure at the data center) can comprise a substantial proportion of the operating expenses for data center maintenance. In addition to purely financial considerations, data center operators may also wish to reduce power consumption as much as possible for environmental reasons, while still providing the best possible service to the clients utilizing the data center. For at least some types of applications, tradeoffs may be possible between power consumption at various computing devices (which may correspond to the utilization levels of the devices) and application performance.

Some data centers may house many different types of computing equipment and related infrastructure components, and the equipment may typically change over time, as may the cost of obtaining electrical power. The dynamic nature, complexity and size of a data center's workload, when combined with the complexity and size of the inventory, may often complicate attempts to reduce or optimize power usage.

Figure 1:
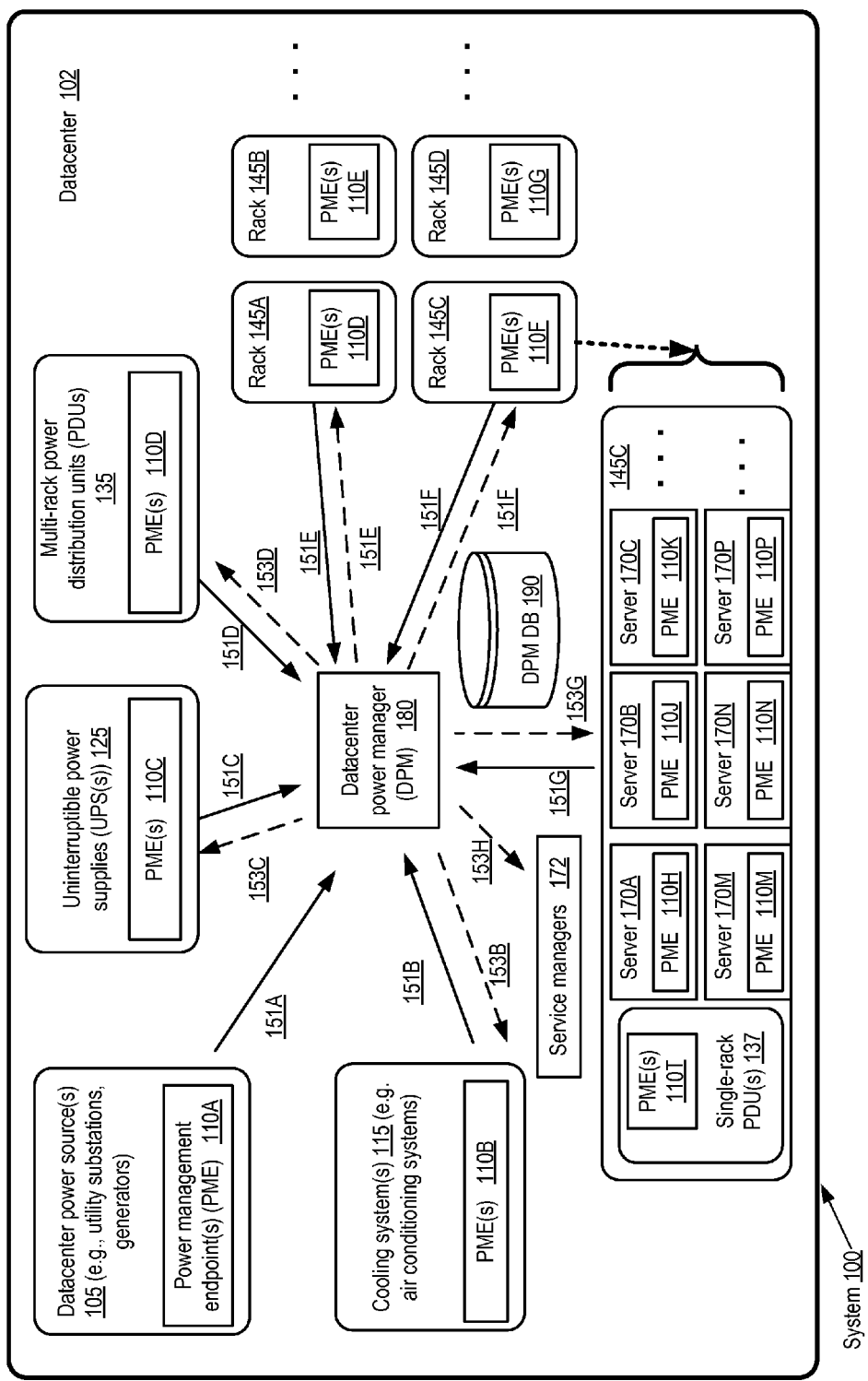
FIG. 1 illustrates an example system environment, according to at least some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

Various embodiments of methods and apparatus for implementing datacenter power management optimizations are described. The term "datacenter", as used herein, refers to a facility whose primary purpose is to house computing devices and supporting infrastructure components. A typical large data center may, for example, comprise hundreds or thousands of computer servers, storage servers, and networking devices (such as routers, switches and the like), redundant power sources (such as various types of power generators), communication connections, air conditioning components, as well as security/safety devices. The various servers may be organized hierarchically in at least some datacenters—e.g., the datacenter may include a number of rooms, each room may include some number of racks, and each rack may house some number of servers.

According to one embodiment, a datacenter power optimization system may include one or more computing devices configured as a datacenter power manager (DPM). The DPM may be configured to perform several different types of operations, including, for example, monitoring and/or collecting various types of metrics from a number of sources in the data center, determining whether power optimization operations are feasible or advisable at a given point in time, initiating the power optimization operations found, and monitoring the impact of the optimizations. To help identify possible optimization operations, a DPM database may be maintained in some embodiments to store datacenter inventory information, location mappings for various computing devices of the datacenter (e.g., indicating where a given device is physically located within the datacenter), server and application workload profiles, resource usage history, power consumption history, log records of previous optimization operations, and the like.

In one embodiment, the sources from which the DPM collects metrics may include a variety of network-accessible endpoints (e.g., implemented in software, hardware or a combination of software and hardware) located at various devices and infrastructure components of the datacenter. These sources may be termed power management endpoints (PMEs) herein. Several different types of PMEs may be instantiated in a given data center in such an embodiment, including respective processes at various computer servers and/or rack controllers, PMEs that are associated with various components of the power distribution infrastructure (such as PMEs at UPSs (uninterruptible power supplies), PDUs (power distribution units), generators, and the like), or PDUs in the cooling infrastructure. At least some types of PMEs may support programmatic control interfaces (such as application programming interfaces) that can be used by the DPM to initiate power configuration changes in one embodiment, such as switching a particular power domain at a rack to a low-power state from a normal-power state or vice versa, or switching between server power states (e.g., using the Advanced Configuration and Power Interface or ACPI). PMEs may be configured to transmit metrics regarding temperature levels, power usage, application workload, resource usage levels and the like to the DPM via one or more secure networking protocols in some embodiments, e.g., in accordance with a predetermined schedule and/or in response to requests from the DPM. Some PMEs may be configured to collect telemetry data from respective sets of sensors, such as temperature sensors, airflow sensors, and the like. In addition to communicating with PMEs, in some embodiments the DPM may communicate with management layers of various network-accessible services being implemented at the data center, e.g., in order to initiate workload changes or scheduling modifications intended to achieve power usage optimizations.

A DPM may periodically (e.g., once every few seconds) collect workload-related and power-related metrics from numerous PMEs distributed across the datacenter in some embodiments, including server endpoints, PDU endpoints, rack endpoints and the like. The metrics may be aggregated together with previously-collected metrics to determine workload trends, thermal trends and/or power usage trends at various components of the datacenter. The DPM may utilize the location mapping information stored in its database to determine the physical locations (e.g., room numbers and/or rack numbers) of various servers, and use server profiles and application workload profiles stored in the database to determine the power/performance characteristics (e.g., watts per operation) of the various servers available. Using the combination of the information obtained from the database and the metrics received from the PMEs, in some embodiments an optimization engine component of the DPM may be able, at least at some points in time, to identify one or more operations that could lead to short-term and/or long-term reductions in power consumption at the datacenter. For example, in some embodiments, the DPM may be able to determine, based on profile information from its database, that transferring workload from one set of servers to another may enable a rack (or a portion of a rack) to be set to a low-power or sleep state, and/or the level of cooling directed to that rack to be reduced (which may reduce power consumed by the cooling infrastructure). Such changes could be made based on time window analysis in some embodiments. For example, the DPM may detect a pattern in which a set of servers almost always has a high workload level during the time period 9 AM-5 PM but has a very low level of utilization during the time period 10 PM-4 AM. In this scenario, it may be possible to run at least some servers at a low-power state during the low-utilization period, e.g., by directing all the work requests during that period to a designated subset of servers that can be kept at normal power state. Similar power-optimized workload redistributions may be initiated at any of several different granularities in some embodiments—e.g., workloads may be migrated from one processing core to another within a single server that enables independent power state control for the different cores, or from one server to another, from one rack power domain to another rack power domain in the same rack, from one rack to another, or even from one data center to another.

In some embodiments, the DPM may also be able to anticipate (e.g., based on its knowledge of application workload patterns and/or based on information from service managers of various services being implemented at the data center) when increases in application workload levels are likely to occur. In such scenarios, the DPM may be able to proactively bring up the power level of some set of servers that are currently in a low-power state, potentially leading to a reduction in the time taken to "warm up" to respond efficiently to client work requests associated with the applications.

In addition to operations that could reduce power consumption, or that bring servers back to a high-power state in anticipation of workloads, in at least some embodiments the DPM may be able to proactively take actions to avoid, or reduce the likelihood of, maximum temperature limits being met at various points in the data center. For example, if an analysis of PME metrics from a given server indicates that the probability of a thermal constraint (e.g., a thermal design point or TDP constraint) being violated at a given server exceeds a threshold, and the DPM can determine a correlation between the workload level at the given server and the temperature, the DPM may initiate the scheduling of workload away from the given server. Such proactive power optimization operations may prevent situations that could otherwise lead to server shutdown and corresponding disruptions of client applications. Proactive prevention of thermal constraint violations at various computing devices may also help to extend the lifetime of the devices in at least some embodiments.

According to one embodiment, the DPM may be configured to classify servers and/or other computing devices of the data center into categories based on the kinds of workloads that are most appropriate for the servers or devices, e.g., from a performance-per-watt perspective. For example, some types of servers with high-end processing cores may be best suited for compute-intensive tasks (and may consume substantial amounts of power), while other servers may consume less power while providing sufficient computing capacity for I/O-bound or memory-bound workloads. In such embodiments, the DPM may combine its knowledge of application workload characteristics with its knowledge of server characteristics to implement power-efficient workload scheduling to achieve improved performance-per-watt characteristics—e.g., those workloads that require high-end processing may be directed to the high-end servers, while those workloads for which the performance capabilities of the low-end servers are sufficient may be directed away from the high-end servers. In contrast, if a workload that is largely I/O-bound or memory-bound is scheduled on a high-end server, the server may consume large amounts of power while waiting for I/O operations to complete, potentially resulting in a lower performance-per-watt metric than if the workload had been scheduled on lower-end servers.

In at least one embodiment, a set of hybrid servers may be installed at the data center, whose power-consumption characteristics may differ from those of the high-end and low-end servers. A given hybrid server may include both high-end, high-power processing cores and low-end, lower-power processing cores (e.g., implementing the same instruction set as the high-end cores) in such an embodiment, such that executable application instructions may be scheduled on either type of core depending on the compute-versus-I/O needs or the compute-versus-memory needs of the application. In some embodiments, shared memory modules may be accessed from either type of core in accordance with a cache coherent non-uniform memory access (ccNUMA) architecture. In other embodiments, the different types of processing elements at a hybrid server may be coupled using other techniques—e.g., a loosely-coupled architecture may be implemented in which more overhead is incurred when processes are migrated from one type of core to another. In scenarios in which the DPM's database does not contain profile information for a given application, the workload of such an application may at least initially be scheduled at one or more hybrid servers. Components of the hybrid servers, such as operating system components, hardware or firmware components, may initially schedule the execution of the instructions at one type of core (e.g., the high-end cores), observe the behavior of the application (e.g., how often the cores are waiting for I/O or memory), and then, if appropriate schedule further execution at the other type of cores in one embodiment. Over time, a profile of the application may be determined, stored in the DPM database, and used for subsequent workload associated with the application. Some applications may comprise different phases (such as cycles of compute-intensive phases followed by I/O-intensive phases), in which case the hybrid servers may be considered optimal for scheduling the applications even after the characteristics of the applications are determined. In some embodiments, an operating system component may be able to interact with lower-level components at a hybrid server to implement fine-grained power level transitions (e.g., less power may be delivered to a core that is not being used heavily). Some types of applications may be scheduled initially on the hybrid servers for profile generation, and scheduled on other classes of servers once their profiles are better understood.

Using the various types of optimizations, including proactive operations to prevent overheating, a DPM may be able to substantially improve power consumption per unit of application workload over time at a given datacenter in at least some embodiments, while at the same time reducing outages that may result from thermal limits being exceeded. In some embodiments, the optimization operations may be correlated with cost savings, and patterns of optimization operations may be shared among DPMs of different data centers, so that lessons learned over time about power efficiencies achievable at one data center can be used to optimize operations at other data centers as well. In one embodiment in which multiple datacenters are operated by the same business organization, some of the optimizations may cross datacenter boundaries—e.g., workloads or application instances may be migrated from one datacenter to another to achieve overall power consumption reductions.

System for Priority Queue Management

FIG. 1 illustrates an example system environment, according to at least some embodiments. As shown, system 100 may include a datacenter power manager (DPM) 180 configured to obtain metrics from, and initiate power optimization operations at, a plurality of power management endpoints (PMEs) 110 distributed among various devices and components of data center 102. A given PME may comprise a network-accessible module (which may be implemented in software, hardware or a combination of software and hardware) configurable to communicate with the DPM 180. For example, PMEs 110A may be associated with power sources 105 of the datacenter 102, such as utility substations or primary or backup generators. PMEs 110C may be associated with uninterruptible power supplies (UPSs) 125 at the data center, while PMEs 110B may be associated with cooling systems 115 (e.g., air conditioning equipment). In the depicted embodiment, a variety of power distribution units (PDUs) may be used, including for example multi-rack PDUs 135 (each configured to distribute power to a plurality of racks) with associated PMEs 110D, and single-rack PDUs 137 (each configured to distribute power to a single rack of servers) with associated PMEs 110T. Servers 170 of the data center may be arranged in racks 145; e.g., servers 170A, 170B, 170C, 170M, 170N and 170P may be installed in rack 145C. At least some servers 170 may include a respective PME 110, e.g., servers 170A, 170B, 170C, 170M, 170N, and 170P may include respective PMEs 110H, 110J, 110K, 110M, 110N and 110P in the depicted embodiment. As shown, at least some of the racks 145 may include respective PMEs as well, independently of the PMEs associated with the PDUs or servers of the rack, e.g., racks 145A, 145B, 145C and 145D include respective PMEs 110D, 110E, 110F and 110G. A particular PME 110 may include one or more software and/or hardware components capable of communicating metrics obtained from the device or component with which it is associated (e.g., from a server 170 or a PDU 135) to the DPM 180. Arrows labeled 151 (e.g., arrows 151A, 151B, 151C, 151D, 151E, 151F and 151G) indicate the flow of metrics from the PMEs to the DPM 180 in the embodiment shown in FIG. 1. Metrics may be obtained by a given PME 110 using any appropriate interface from various data sources—e.g., from thermal sensors, power sensors, air-flow sensors, on-chip counters of various kinds (including performance counters), software entities such as kernel modules or performance analysis tools, device controllers, thermostats, and the like.

A DPM database 190 may be used to store various types of information usable to make power optimization decisions in the depicted embodiment. For example, the database 190 may include previously collected metrics from the different PMEs 110 (which may be useful for trend analysis), inventory information listing the various types of computing and power-related devices, sensors and components at datacenter 102, as well as location mappings indicating specifically where within the datacenter each device, component or sensor is located (e.g., at which rack 145 a given server 170 is installed). In at least some embodiments, the DPM database 190 may also be used to store at least two types of profile information: server profiles indicating the performance and power consumption characteristics of different servers 170 or server categories, as well as application workload profiles characterizing the resource consumption patterns for different client applications that are executed at the servers 170. Server profiles may for example characterize different server models or brands based on their computation capabilities, I/O capabilities, memory capabilities, networking capabilities, power consumption levels, and the like. The profile information for a particular application may, for example, indicate the overall performance characteristics of the application (e.g., whether in general the application is compute-bound, I/O-bound, or memory-bound), whether there is a predictable time-based variation in resource usage by the application (e.g., whether a server at which the application runs is expected to have low utilization time windows and high utilization time windows in a predictable pattern), the network bandwidth and latency requirements of the application, and other similar data.

The DPM 180 may be configured to try to achieve one or more power-related goals in some embodiments, such as an overall goal to reduce power consumption without affecting application performance by more than X %, a goal to reduce power-related expenses by Y % during the course of a year, and/or a goal to prevent more than P power-related server shutdowns during a year. Based on some combination of the metrics received by the DPM 180 from the PMEs 110, and the information stored in its database 190, the DPM 180 may be able to identify opportunities for various types of power-related optimizations, and/or opportunities for proactive preventive actions to avoid power-related error or failure conditions in the depicted embodiment at various points in time. When it identifies such an opportunity, the DPM may initiate one or more operations, which may include for example workload scheduling changes (e.g., directing incoming work requests to selected servers or migrating application instances or processes between different sets of servers, to lower overall power consumption levels at the data center or to prevent overheating that may lead to shutdown), and/or power configuration changes (e.g., setting the power state of a group of servers to "deep sleep" or other low-power states). Arrows labeled 153 (e.g., 153B, 153C, 153D, 153E, 153F, 153G and 153H) indicate the direction in which commands or control signals to initiate various operations may be transmitted from the DPM 180 in the depicted embodiment. The DPM may use one or more programmatic interfaces such as APIs supported by the various PMEs 110 to transmit its requests or commands to initiate or perform various operations, including for example various device-type-specific APIs or server-supported APIs such as ACPI. It is noted that some PMEs 110 may be configured primarily for metric collection, and may not provide interfaces for initiating operations—e.g., PME 110A in the depicted embodiment may be used primarily for verifying that the power sources 105 are operating normally, and may not be configured to accept any commands or instructions from the DPM 180. Other PMEs 110 may be configured both for collecting and transmitting metrics to the DPM 180, and receiving commands or instructions from the DPM 180, while yet other PMEs may be configured primarily to accept commands from the DPM 180 in some embodiments.

In some embodiments, some of the operations initiated for power-related optimizations by the DPM may involve the use of intermediaries such as service managers 172. A service manager 172 may be responsible for distributing incoming workloads for applications related to a network-accessible multi-tenant service implemented at the datacenter 102 in the depicted embodiment, for migrating application instances or processes between servers, and/or for admission control decisions regarding incoming work requests (e.g., to decide whether to accept or reject a work request from a client for a service). Accordingly, if the DPM 180 determines that the workload associated with a particular application should be directed to a selected server, in some such embodiments the DPM 180 may communicate the desired scheduling parameters to a service manager 172 responsible for that application, and the service manager 172 may implement the requested workload distribution.

Datacenter Power Manager Components

Figure 2:
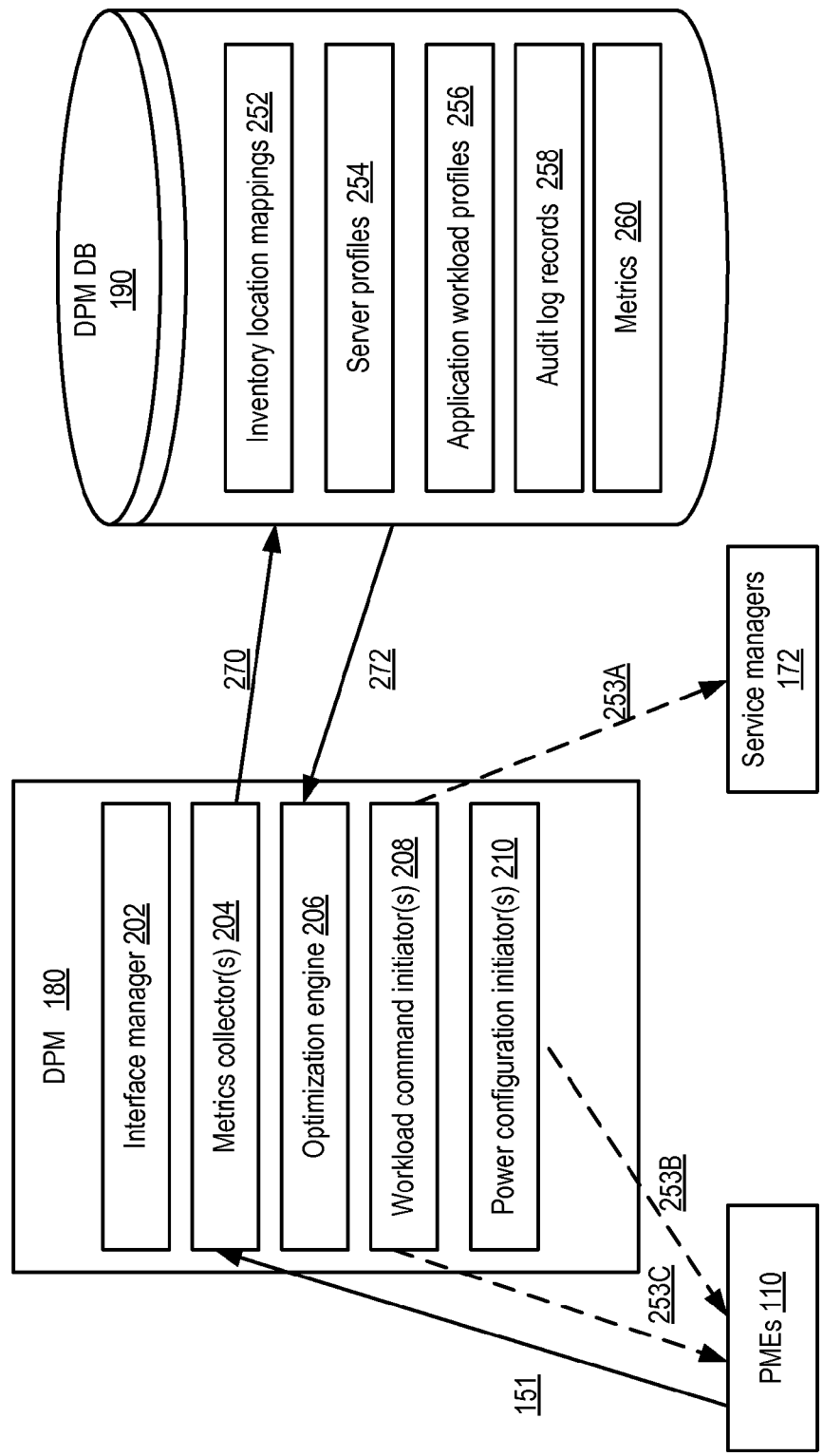
FIG. 2 illustrates example components of a datacenter power manager, according to at least some embodiments.

FIG. 2 illustrates example components of a DPM 180, according to at least some embodiments. As noted earlier, the DPM 180 may interact with the PMEs 110 via one or more programmatic interfaces. An interface manager 202 may be responsible for implementing the programmatic interfaces at the DPM end of the communications with the PMEs in the depicted embodiment. The interface manager 202 may also support other programmatic interfaces in at least some embodiments, e.g., administrative interfaces for configuring and managing the DPM itself, interfaces used to communicate with service managers 172, and/or interfaces used to interact with inventory databases or other components of the datacenter 102. Some or all of the other components of DPM 180 shown in FIG. 2 may utilize the interface manager 202 for their external interactions.

Metrics collectors 204 may be responsible for gathering various types of measurements from PMEs 110 in the depicted embodiment, as indicated by arrow 151. In some embodiments, a plurality of metrics collector modules may be implemented, each responsible for obtaining metrics from a respective type of PME 110 via a respective programmatic interface, independently and asynchronously with respect to the other metrics collector modules. The parameters of metric collection may differ for different PMEs, or even for different types of data collected from the same PME—e.g., the rate at which workload data is collected from a particular server PME may differ from the rate at which thermal metrics are collected from that same server PME, and both of those rates may differ from the rate at which airflow sensor data is collected from a cooling system's PME. Metrics collectors may store at least some of the collected metrics 260 in the DPM database 190 in some embodiments, as indicated by the arrow labeled 270.

Optimization engine 206 may be responsible for analyzing the metrics collected from the various PMEs, together with the inventory location mappings 252, server profiles 254, and application workload profiles 256 obtained from the DPM database 190 (as indicated by arrow 272), and determining if and when various types of power optimization operations are to be attempted in view of the DPM's optimization goals. In some embodiments, the optimization engine 206 may utilize artificial intelligence techniques, such as machine learning or pattern recognition techniques, to identify the optimization opportunities, and may be configured to build up a set of heuristics or rules for identifying the opportunities over time. In some embodiments, the optimization engine 206 may be configured to operate in cycles, e.g., it may analyze the available data in a given cycle, and if no optimization operations are found, it may enter a dormant or sleep state for X seconds or minutes until the next cycle of analysis starts.

If the optimization engine 206 determines that some set of optimization operations should be initiated, workload command initiator(s) 208 and/or power configuration initiator(s) 210 may be invoked. Workload command initiators 208 may be responsible for issuing requests to modify application workload distribution to various servers 170, e.g., either via communications 253C to some subset of PMEs, or via communications 253A to service managers 172 of the affected applications and services. Application workload distribution may include, for example, either directing work requests to selected servers, migrating application processes or instances to different servers, or both work request scheduling and application migration operations. Power configuration initiators 210 may be responsible for changing power settings, e.g., transitioning a rack or a power domain within a rack from a normal power state to a low power state or vice versa via communications 253B with the appropriate PMEs. In the depicted embodiment, audit log records 258 may be stored in the DPM database 290 for some or all of the optimization operations initiated, so that, for example, an analysis of the benefits achieved may be performed. In at least some embodiments, audit log records 258 may comprise historical records of power usage associated with various types of applications, servers, and the like, and such historical records may be consulted by the DPM in some implementations to decide whether or when to implement a particular optimization. In various embodiments, historical records may also be included in server profiles and/or application profiles that are used for making optimization decisions. Such historical data may also be used by the DPM to improve its effectiveness over time in some embodiments, e.g., using various types artificial intelligence techniques.

It is noted that in some embodiments, some or all of the various components of the DPM 180 shown in FIG. 2 may be implemented on different computing devices—e.g., the DPM functionality may be implemented in a distributed manner using a plurality of hardware and/or software components. In other embodiments, a single server may be responsible for the DPM functionality. Similarly, the DPM database 190 may also be implemented as a single standalone entity in some embodiments, and as a distributed system in other embodiments. In some embodiments, the DPM 180 and/or its database 190 may be implemented in a high-availability configuration, e.g., with a plurality of servers and/or storage devices set up such that single points of failure are eliminated.

Proactive DPM Operations

Figure 3A:
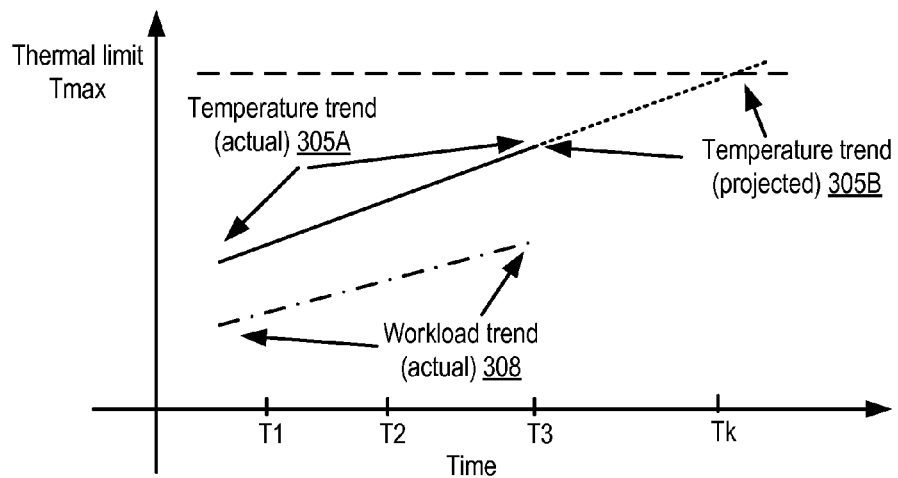
FIGS. 3a and 3b illustrate an example of a proactive scheduling operation that may be initiated by a datacenter power manager, according to at least some embodiments.
Figure 3B:
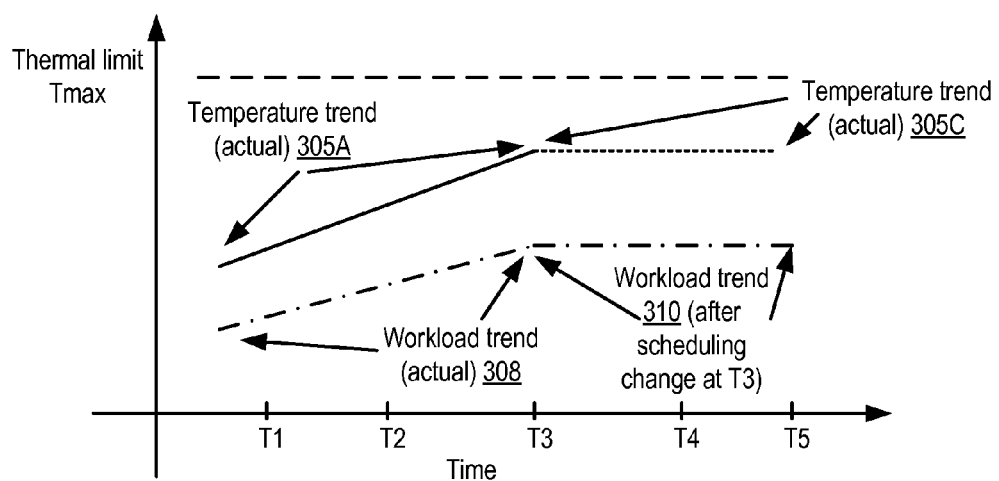

In some embodiments, the DPM 180 may be configured to use trend analysis on the collected metrics and information about server and workload characteristics available in the DPM database 190 to perform proactive operations that may help to reduce the chances of thermally-induced application disruptions. FIGS. 3a and 3b illustrate an example of a proactive scheduling operation that may be initiated by a datacenter power manager, according to at least some embodiments. In both FIGS. 3a and 3b, the X-axis represents time, while the Y-axis represents both temperature trends as well as workload level trends at a particular server 170. In FIG. 3a, the DPM 180 has collected, and performed trend analysis on, workload information collected from time T1 through time T3, as indicated by the actual workload trend line 308. Similarly, server temperature metrics collected from time T1 through time T3 indicate the trend illustrated by actual temperature trend line 305A. The DPM 180 (e.g., the optimization engine component 206 of the DPM) may determine that a strong correlation exists between the workload level and the temperature at the server. Server profile information about the server may indicate to the DPM 180 that if the current temperature trends continue, the maximum temperature (thermal limit Tmax, corresponding to the thermal design power (TDP) value for the server) that the server can safely sustain may be reached at time Tk, as indicated by the projected temperature trend line 305B.

Accordingly, in the depicted embodiment, the DPM 180 may initiate a workload scheduling modification, directing additional workload away from the server. For example, the DPM 180 may send a request for such workload redirection to one or more service managers 172 responsible for assignment of incoming workload requests to servers, or the DPM 180 may send a command to a PME on the server to refuse to accept additional tasks. As a result, the workload level at the server may stabilize, as indicated by the workload trend line 310 shown in FIG. 3b. If the DPM's correlation analysis is accurate, the temperature trend may also be modified as a result of the scheduling change, as indicated by the actual temperature trend line 305C showing the measured temperature from time T3 through T5. In this way, the DPM 180 may be able to prevent potential disruptions to client applications, failures of client requests, or even hardware replacement that may have resulted from a shutdown caused by the server exceeding its supported maximum temperature. Prevention or reduction of thermal stresses may also lead to an extension of the lifetime of the affected devices in some cases. Similar proactive operations may be performed using the DPM's optimization engine and database for other types of devices as well in some embodiments, such as storage devices, power-distribution devices and the like. In some embodiments, when the trends shown in FIG. 3a are identified, the DPM 180 may initiate other operations in addition to the workload change described above—e.g., the DPM 180 may issue a command to a PME that can increase the cooling (e.g., the airflow rate) to the server.

Power State Changes Based on Workload Redistribution

Figure 4A:
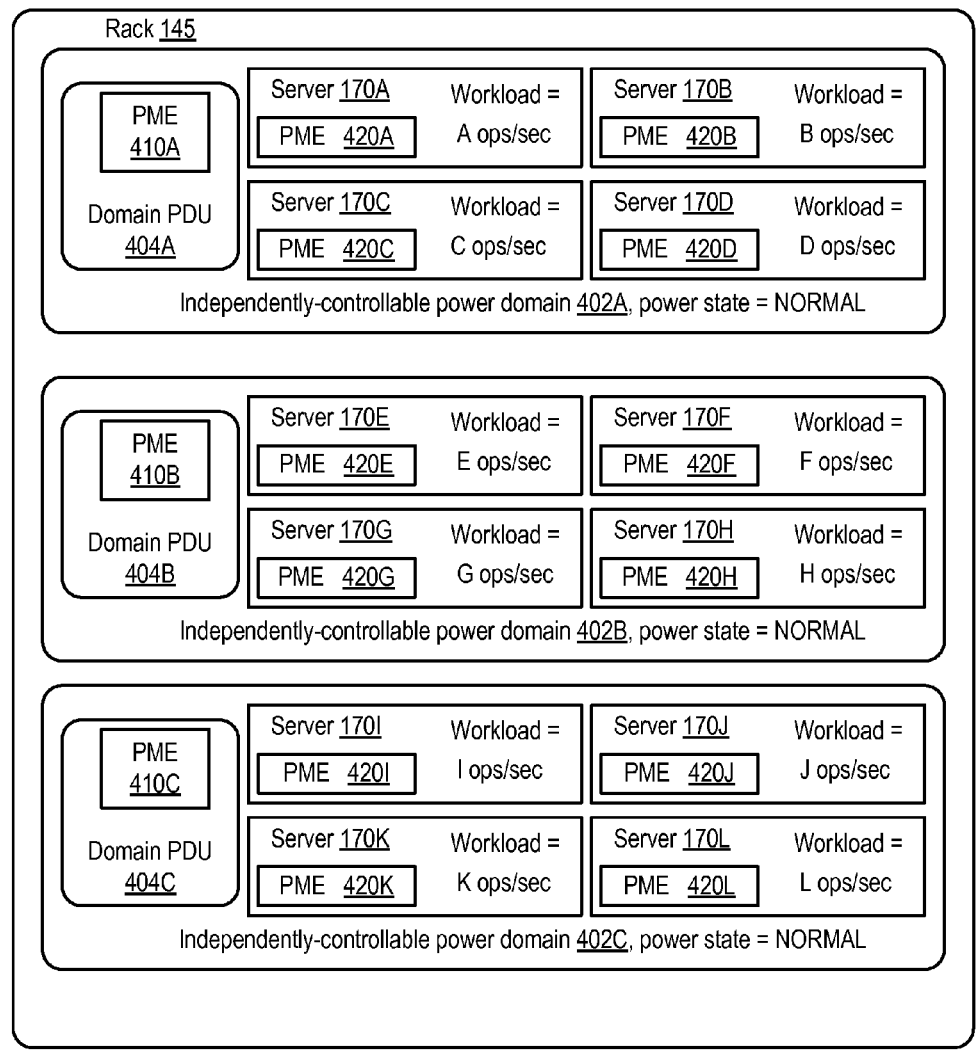
FIGS. 4a and 4b illustrate an example of a scheduling operation initiated by a datacenter power manager at a rack with a plurality of independently controlled power domains, according to at least some embodiments.
Figure 4B:
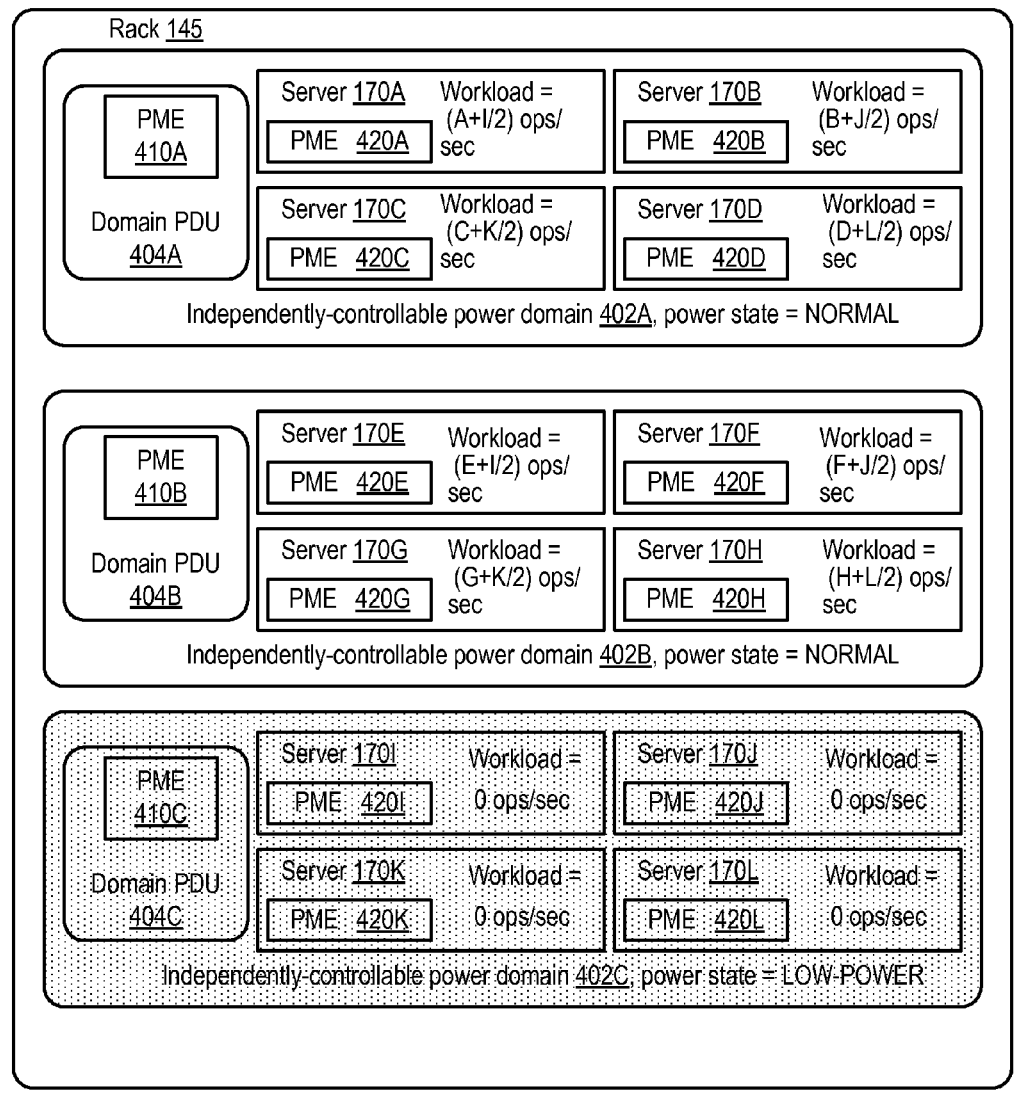

In some embodiments, the DPM 180 may be able to generate substantial power savings by intelligently redistributing workloads and changing power settings accordingly. FIGS. 4a and 4b illustrate an example of a scheduling operation initiated by a datacenter power manager at a rack with a plurality of independently controlled power domains, according to at least some embodiments. As shown in FIG. 4a, the power distribution components of a particular server rack 145 may be organized as a collection of independently controllable power domains 402A, 402B and 402C, each with a respective domain PDU 404. Thus, in the depicted embodiment, power distribution to the servers 170A, 170B, 170C and 170D may be governed by domain PDU 404A with a corresponding PME 410A. Similarly, power distribution to the servers 170E, 170F, 170G and 170H may be controlled by domain PDU 404B with PME 410B, and power distribution to the servers 170I, 170J, 170K and 170L may be controlled by domain PDU 404C with PME 410C. Each of the domain PDUs 404A, 404B and 404C may modify the power state of their respective power domain (e.g. domain 402A, 402B or 402C) independently of the power state of the other domains in the depicted embodiment.

In FIG. 4a, for ease of presentation, each of the depicted servers is shown executing respective amounts of workload of the same application or service, expressed in units of operations per second (ops/sec). Metrics provided to the DPM 180 by the server PMEs 420 (e.g., PMEs 420A, 420B, 420C, 420D, 420P, 420F, 420G, 420H, 420I, 420J, 420K and 420L) indicate that, as of a particular time or time period, the respective workload at servers 170A, 170B, 170C, 170D, 170E, 170F, 170G, 170H, 170I, 170J, 170K, and 170L is A ops/sec, B ops/sec, C ops/sec, D ops/sec, E ops/sec, F ops/sec, G ops/sec, H ops/sec, I ops/sec, J ops/sec, K ops/sec, and L ops/sec. Furthermore, the PMEs 410A, 410B and 410C have indicated to the DPM that the power state of each of the power domains is NORMAL—i.e., that the three power domains are each in a normal operating state, with some amount of power being distributed to each of the servers based on the server's typical power consumption profile.

In accordance with a power use reduction goal, and in view of the fact that power is independently controllable for each power domain 402, the DPM 180 may attempt to determine whether moving workload from some set of servers 170 to a different set of servers can help to reduce the total power consumption in the three power domains shown in the depicted embodiment. For example, the DPM 180 may determine that several or all of the servers in power domain 402A and 402B are capable of handling more workload, and that distributing the workload of the servers of power domain 402C among the servers of domains 402A and 402B may reduce the workload of power domain 402C sufficiently to allow domain 402C to be brought to a low-power state, without materially affecting the performance as perceived by the clients on whose behalf the operations are running, and without substantial increases in the power consumption levels in domain 402A and 402B. In some embodiments, the DPM 180 may perform a multidimensional cost-benefit analysis, comparing the costs and benefits of transferring workload from power domain 402C to power domains 402A and 402B, taking into account factors such as the total power consumed for the workload as a whole, effects on client-perceived performance, overheads involved in the transfer, risks of having to re-transfer the workload again in the short term, risks of encountering any of various system capability limits such as thermal limits, likelihood that the overall workload is going to change substantially in the near future, and so on.

Figure 5:
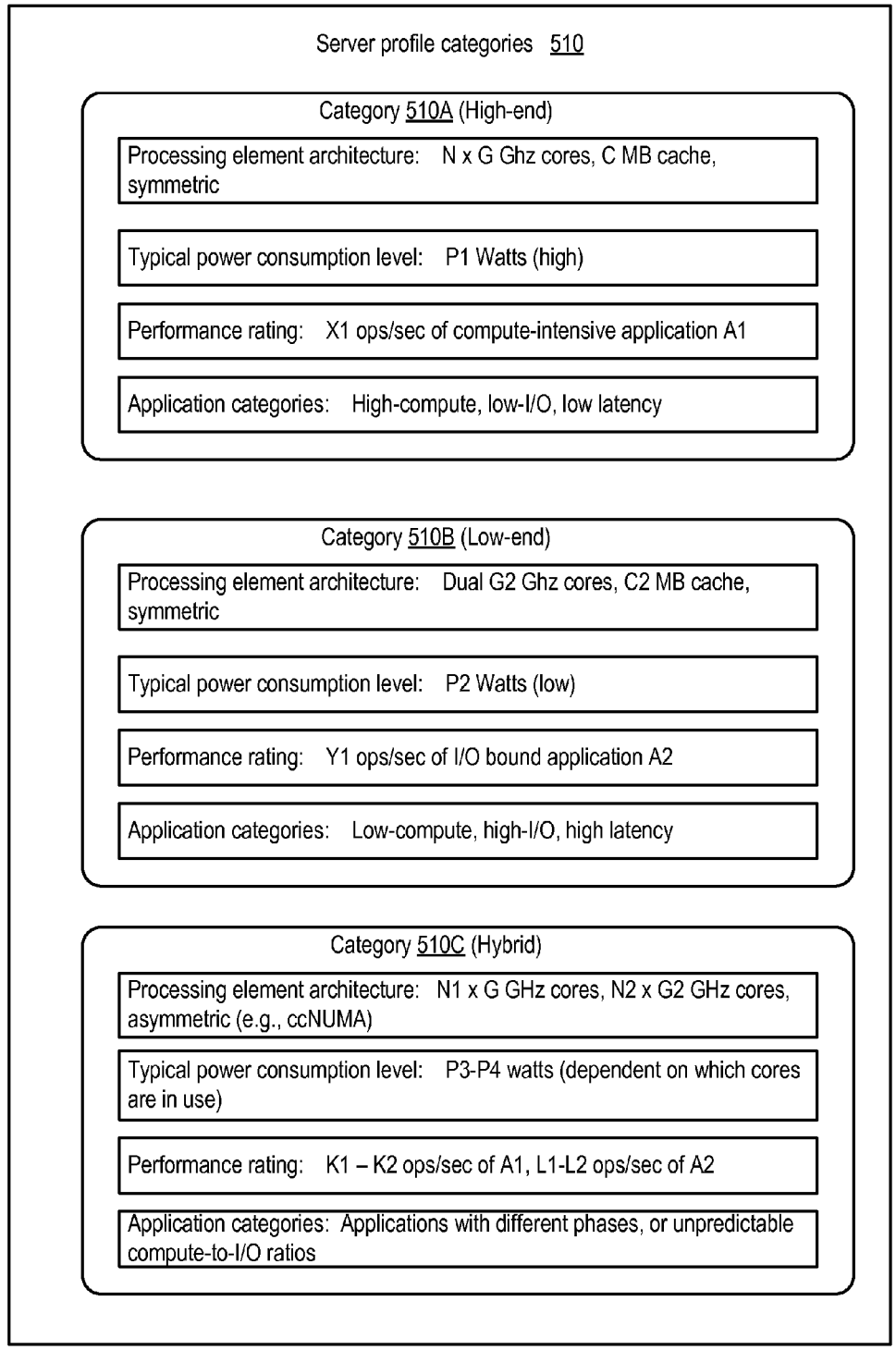
FIG. 5 illustrates example server profile categories that may be used by a datacenter power manager, according to at least some embodiments.

FIG. 4b illustrates an example redistribution of the workload shown in FIG. 4a, according to one embodiment. In FIG. 4b, half of the workload previously being handled by each of the servers 170I, 170J, 170K and 170L has been transferred to a server in power domain 402A, while the other half has been transferred to a server in power domain 402B. For example, server 170I was previously handling I ops/sec; now, I/2 ops/sec of that workload have been added to the workload of server 170A, and the remaining I/2 of that workload has been added to the workload of server 170E. Accordingly, server 170A's new workload is (A+I/2) ops/sec, and server 170E's new workload is (E+I/2) ops/sec. As a result of transferring the work away from the servers of power domain 402C, domain 402C can now be set to a LOW-POWER state (as indicated by the shaded representation of power domain 402C in FIG. 4b). Meanwhile, the other power domains 402A and 402B remain at NORMAL power levels. Thus, in the illustrated example, a substantial reduction of power consumption may be achieved by consolidating workload onto a smaller set of servers. Similar types of workload migration optimizations may be performed at any of various granularity levels in different embodiments—e.g., workload may be migrated from one core to another of a multi-sore server with independently powered cores, from one server to another within a rack, from one rack to another, or from one datacenter to another.
Matching Workload Profiles with Server Profiles In some datacenters, several different types of servers 170 may be available. In some scenarios it may be possible for the DPM 180 to categorize the servers into groups, with each group comprising servers with similar performance and/or power consumption characteristics, and to then initiate the assignment of application workloads to servers of the appropriate categories to achieve overall power usage reductions. FIG. 5 illustrates example server profile categories that may be used by a DPM 180, according to at least some embodiments. As shown, servers are grouped into three categories 510 in the depicted embodiment: high-end category 510A, low-end category 510B, and a hybrid category 510C. Categories 510 may also be referred to herein as "capability categories". Information about several different characteristics of the servers of each category may be stored in the DPM database 190, including processing elements available (e.g., the number and specifications of general-purpose or special purpose cores or processors), power consumption levels, application performance ratings, and matching application types.

Servers in the high-end capability category 510A are characterized as having N processing cores with clock speeds G1 GHz each, C1 megabytes of cache memory and a symmetric multiprocessing architecture in the depicted embodiment. The typical power consumption level is P1 watts for category 510A, and the servers of category 510A are best suited for compute intensive, low latency, low-I/O applications such as application A1, for which a performance level of X1 operations per second can be achieved. Servers in the low-end capability category 510B are characterized as having two processors with clock speeds G2 GHz each, C2 megabytes of cache memory and a symmetric multiprocessing architecture in the depicted embodiment. The typical power consumption level is P2 watts for low-end category 510B, and the servers of category 510B are best suited for low-compute high-I/O applications such as application A2, for which a performance level of Y1 operations per second can be achieved.

The third capability category of servers, hybrid servers 510C, use a combination of high-end processing cores and low-end processing cores in a ccNUMA (cache coherent non-uniform memory architecture) arrangement in the depicted embodiment. Thus, each server of category 510C comprises N1 cores of clock speed G GHz, and N2 cores of clock speed G2 GHz. The typical power consumption varies between P1 and P2 watts, depending on the extent to which each type of cores is being used—for example, the hybrid server may make it possible to reduce power to cores of one type during time periods in which those cores are mostly idle. Similarly, the performance capabilities of the hybrid servers may lie along the spectrum between the high-end and low-end servers. A range of between K1 and K2 operations per second of application A1, or a range of between L1 and L2 operations per second of application A2, is shown for the hybrid servers. As mentioned above, hybrid servers may be appropriate for use for at least two types of application workloads: applications with unknown or unpredictable resource consumption patterns, or applications with distinct phases of compute-intensive operations and I/O-intensive operations. Applications whose behavior (i.e., in terms of compute versus I/O or compute versus memory ratios) is not well understood may be directed to hybrid servers, and executed at either type of processing core based on the observed characteristics of the application, until the resource consumption patterns of the application become better understood. If the resource consumption patterns indicate that the application can be characterized as compute-intensive, the application may be characterized as being best suited for high-end servers of category 510A; if the patterns indicate that the application can be characterized as low-compute, high-I/O, the application may be designated as being suited for low-end servers of category 510B. If the behavior and resource consumption patterns are unpredictable or comprise distinct phases with respect to compute intensive operations versus I/O, the application may be best suited for hybrid servers of category 510C. It is noted that any of several different types of hybrid server architectures may be implemented in different embodiments, and that the scheduling of workloads to the different types of processing elements within a hybrid server may be performed at various levels and by various hardware and/or software scheduling entities (e.g., at the process level by operating system schedulers, or at finer granularities such as blocks of executable instructions).

Using its knowledge of server performance and power profiles and its characterization of applications, DPM 180 may attempt to ensure that application workloads are directed to those servers to which the workload is best suited, e.g., by issuing commands or directives to service managers 172. If the DPM's commands are implemented, potential power wastage (such as may occur if I/O-intensive workloads are directed to high-end servers) may be reduced or avoided in some embodiments. It is noted that in at least some embodiments, a different number of server profile categories may be used than that shown in FIG. 5 (e.g., the DPM may categorize servers into more than three categories, based on the types of hardware and software available at the data center).

Methods for Datacenter Power Optimization

Figure 6:
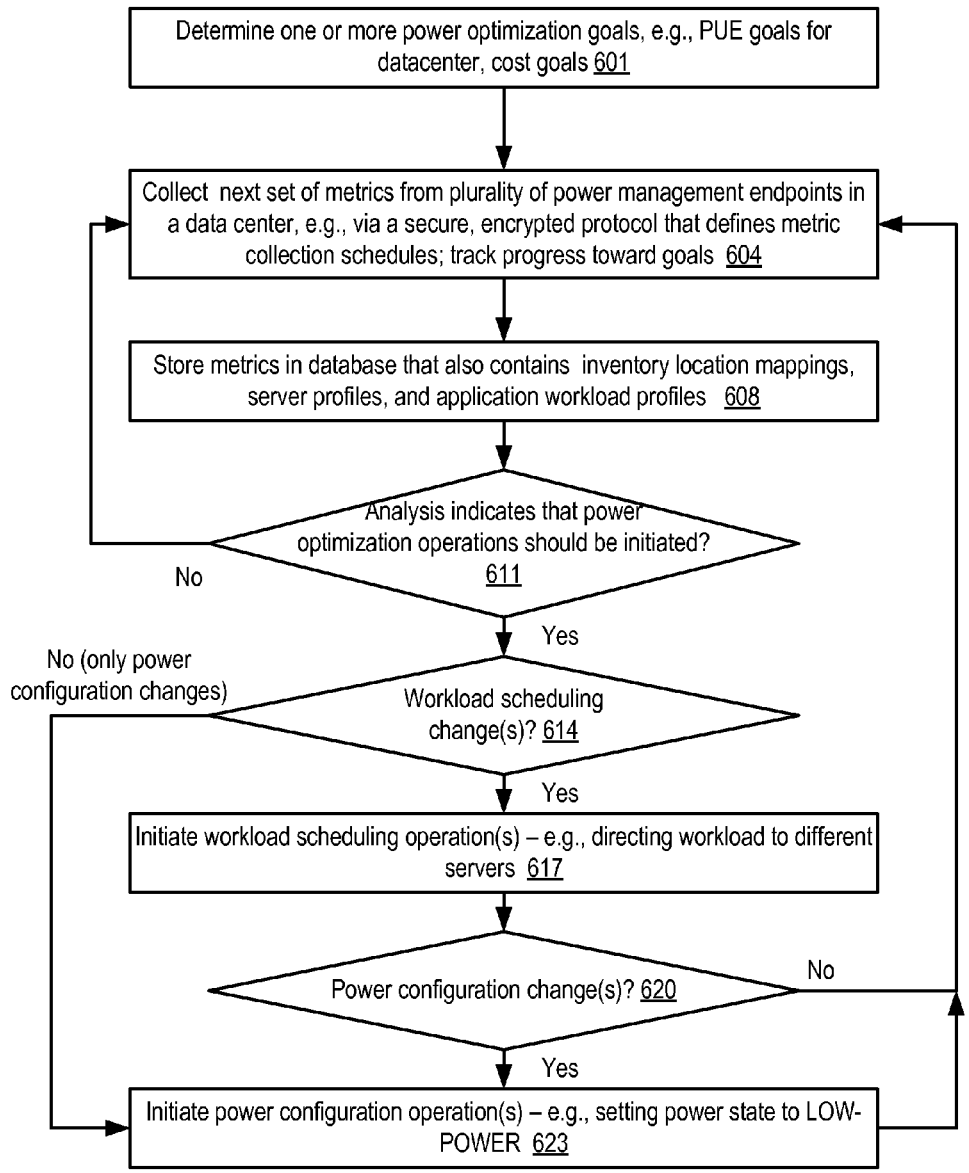
FIG. 6 is a flow diagram illustrating aspects of operations that may be performed by a datacenter power manager to optimize power usage, according to at least some embodiments.

FIG. 6 is a flow diagram illustrating aspects of operations that may be performed by a DPM 180 to optimize power usage, according to at least some embodiments. As shown in element 601, a set of goals may be determined for power usage-related optimizations at a datacenter 102, e.g., power usage reduction goals, power usage effectiveness (PUE) goals, and/or power cost reduction goals. Power usage effectiveness (PUE) for a given datacenter may be determined in some embodiments by dividing the total amount of power entering the datacenter by the power used to run the computing infrastructure within the datacenter; thus, the closer the PUE is to 1, the lower the power consumption overhead. In some embodiments the data center operator or administrative staff may specify specific targets or goals to the DPM 180, while in other embodiments the goals may be implicit—e.g., the DPM may be tasked with reducing overall power usage as much as possible, and its effectiveness may be judged based on an analysis of power-related expenses and the types of audit log records 258 corresponding to attempted optimization operations illustrated in FIG. 2

The DPM 180 may be configured to operate in cycles, during each of which it performs some amount of analysis in an attempt to identify possible optimizations, and initiates some or all of the feasible optimizations identified. As indicated in element 604, during one of these cycles, the DPM 180 may collect the next set of metrics from the various PMEs 110 in the datacenter 102, e.g., via a secure, encrypted protocol that defines metrics collection schedules for each of the metric types collected. The DPM 180 may also be configured to track its own progress in achieving power-related goals, e.g., to determine whether sufficient optimization has already been achieved in a given time period. The collected metrics may be stored in a DPM database 190 (element 608), e.g., together with location mappings for various devices in the datacenter's inventory, server profiles, application workload profiles, and the like. The DPM (e.g., using optimization engine 206) may determine whether, based on the analysis of collected metrics as well as database contents, some set of power optimization operations is feasible or advisable.

If an appropriate power optimization operation is identified for implementation (as detected in element 611), the DPM may initiate the corresponding workload changes and/or power configuration changes. Some power optimization operations may involve both workload modifications and power settings changes, while other optimizations may involve just one of the two types of changes. If the optimization involves workload scheduling change(s), as detected in element 614, the DPM may issue to corresponding scheduling command or requests to PMEs 110 and/or to service managers 172, e.g., to redirect workload requests to a different set of servers (element 617). If the optimization also involves power configuration changes (as detected in element 620) or involves only power configuration changes (as also detected in element 614), commands to make the appropriate changes (such as changing power state at a power domain of a rack to low power, or changing power state at a given processing core or CPU to low power) may be issued to the appropriate PMEs (element 623).

The DPM may perform the set of operations corresponding to elements 614-623 for each identified optimization operation in the depicted embodiment. After all the optimization operations have been initiated, the DPM 180 may wait for the next set of metrics to be collected, e.g., during its next cycle. If no optimization operations were found for implementation, as detected in element 611, the DPM 180 may enter a dormant or sleep state until the next set of metrics arrive, at which point the analysis and search for optimizations may be resumed.

Figure 7:
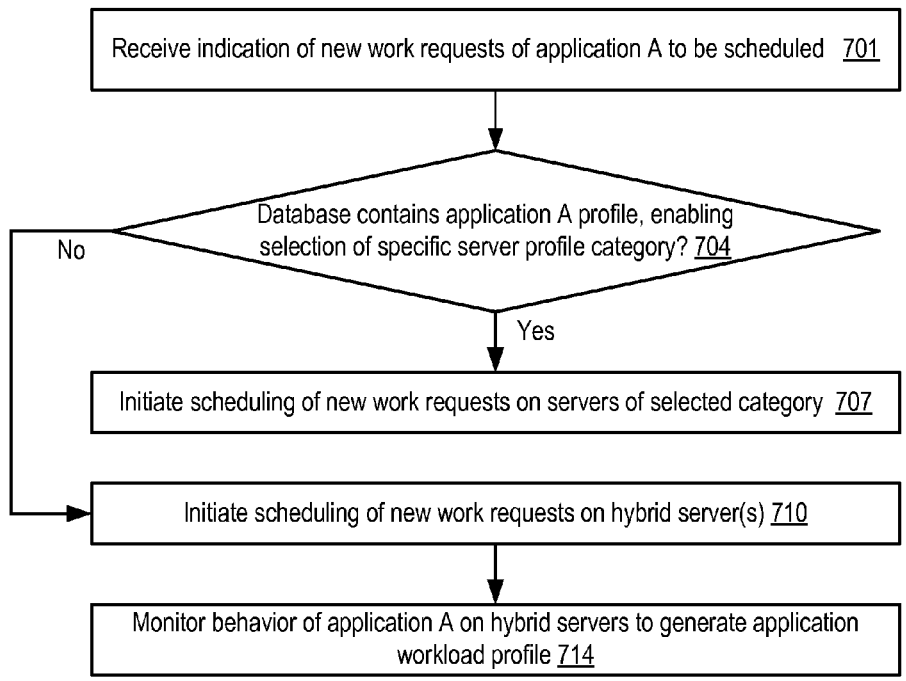
FIG. 7 is a flow diagram illustrating aspects of operations that may be performed by a datacenter power manager to select servers on which workloads are to be scheduled, according to at least some embodiments.

FIG. 7 is a flow diagram illustrating aspects of operations that may be performed by a DPM 180 to select servers on which workloads are to be scheduled in a power-efficient manner, according to at least some embodiments. As shown in element 701, the DPM 180 may determine (e.g., based on indications from service managers 172) that new workload requests for an application A are to be scheduled for execution at servers of the datacenter 102. The DPM 180 may consult its database 190 to determine (a) whether a workload profile of application A is available, indicating whether for example the application is compute-intensive, I/O-intensive, or has some other predictable resource consumption behavior (b) whether a server profile category appropriate for the new workload exists (e.g., whether there is a match between the characteristics of the application workload and the capabilities and power consumption characteristics of some class of servers in view of the DPM's power-consumption goals) and (c) whether sufficient servers of an appropriate category are available for performing the new workload requests. If a match is found between the application profile and server profile category (as detected in element 704), the DPM 180 may issue command or instructions to the appropriate server managers 172 to schedule the new workload on an appropriate set of servers of the matching category (element 707).

If, however, information about the characteristics of the new workload is not available in the DPM database 190, as also detected in element 704, in the depicted embodiment the DPM 180 may initiate the scheduling of the new work requests on some set of hybrid servers (element 710) similar to those described above with respect to FIG. 5. After the workload has been scheduled on the hybrid servers, in some embodiments the DPM 180 may monitor metrics collected from the hybrid servers to generate an application workload profile, and store the profile in the DPM database 190 for future use. The profile generated may indicate, for example, that the application A is compute-intensive and is best suited to high-end servers. Alternatively, the profile generated may indicate that the application A is I/O-intensive or memory-intensive and is therefore best suited to low end-servers, or that the application does not neatly fit into either the compute-intensive or the I/O-intensive categories, and so may be appropriate for hybrid servers at which power consumption may be optimized internally by switching instruction executions from one type of core to another.

Figure 8:
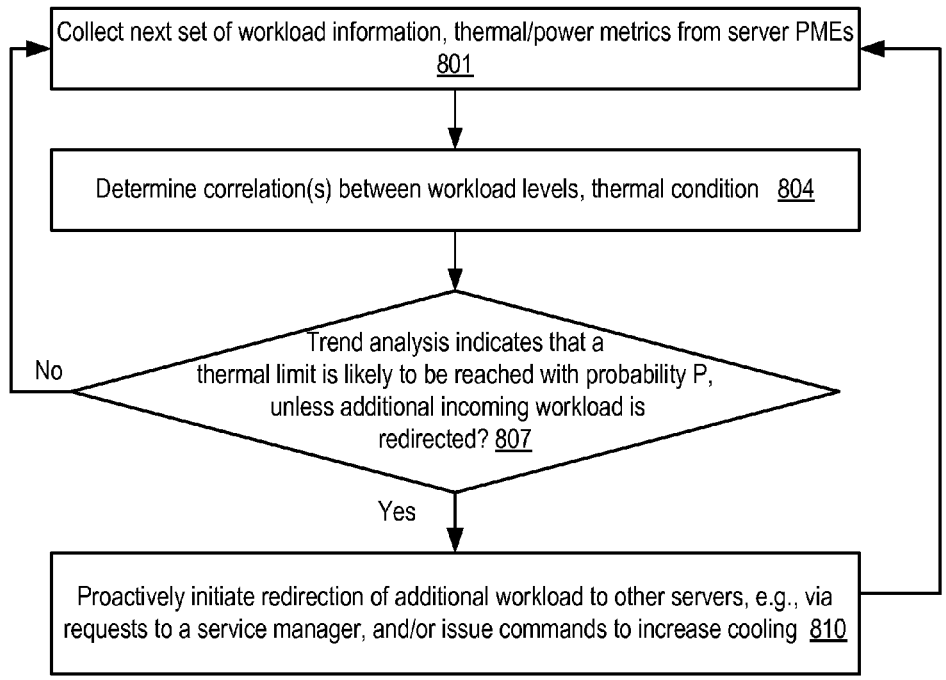
FIG. 8 is a flow diagram illustrating aspects of proactive operations that may be initiated by a datacenter power manager based on thermal trend analysis, according to at least some embodiments.

FIG. 8 is a flow diagram illustrating aspects of proactive operations that may be initiated by a DPM 180 based on thermal trend analysis, according to at least some embodiments. As shown in element 801, the DPM 180 collect the next set of workload information as well as thermal and power metrics from a set of PMEs associated with a given server 170. The DPM 180 may then determine whether statistically significant correlations exist between the workload levels and the thermal or power-usage conditions of the server—e.g., by combining the most recent metrics with earlier-obtained metrics and determining trends in the values collected (element 804).

If the trend analysis and/or correlation computations indicate that a thermal limit (such as a maximum ambient temperature) is likely to be reached with some threshold probability P at the server unless some changes to workload or ambient conditions is made (as detected in element 807), the DPM may proactively initiate the redirection of additional workload to a different server (element 810). In some embodiments, other proactive actions may also or instead be taken, such as increasing the cooling at the server, and/or transferring existing workload away from the server. If no danger of reaching a thermal limit is detected in operations corresponding to element 807, the DPM 180 may resume its collection of additional metrics and their analysis.

Figure 9:
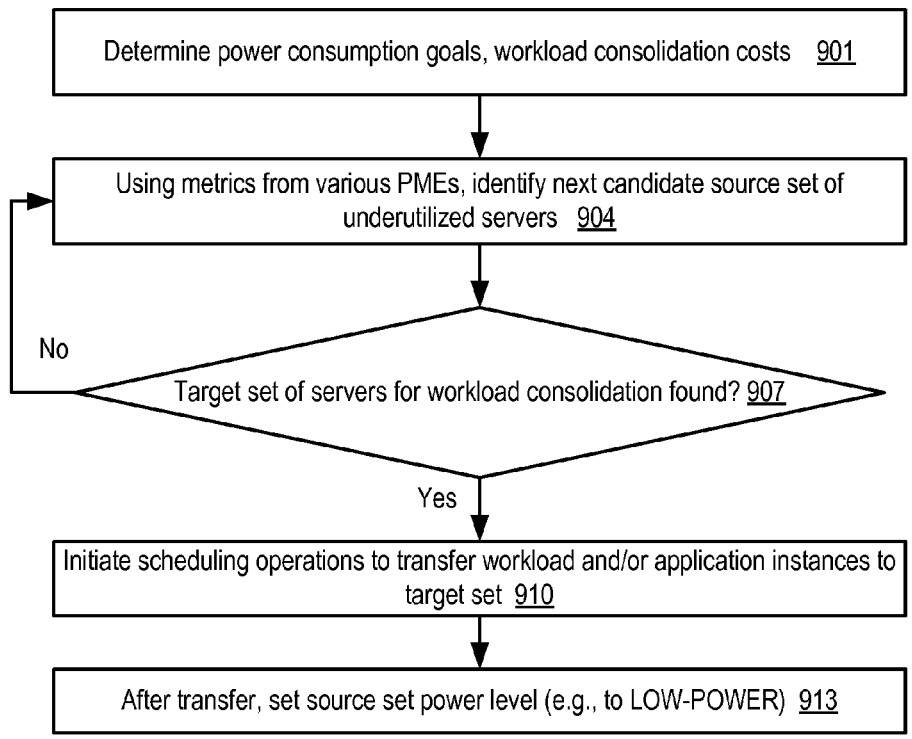
FIG. 9 is a flow diagram illustrating aspects of operations that may be initiated by a datacenter power manager to transfer workloads between servers, according to at least some embodiments.

FIG. 9 is a flow diagram illustrating aspects of operations that may be initiated by a datacenter power manager to transfer workloads between servers, according to at least some embodiments. As shown in element 901, the DPM may determine a set of power consumption goals, as well as an indication of the costs (e.g., computing overhead) associated with consolidating application workload by transferring work operations from one set of servers to another. Using the metrics collected from various PMEs at the servers of the datacenter 102, the DPM 180 may identify one or more candidate sets of underutilized servers, which may be termed "source servers" with respect to possible workload transfers (element 904). Whether a server is to be considered underutilized may be determined based on one or more criteria, such as administrator-specified resource utilization limits, or based on the DPM's own accumulated knowledge of previous optimization operations.

For any given set of source servers that are deemed to be underutilized, the DPM 180 may attempt to find a matching target servers to which the workload may be efficiently transferred or migrated for a net reduction in power consumption. Target servers may be identified based on server ownership (e.g., workloads may only be transferred among servers that a given client owns or can be assigned in some embodiments), their current utilization levels (also represented in the metrics available to the DPM 180), their profiles (e.g., only servers that can perform the transferred operations with adequate performance may be selectable as targets), and/or the overhead associated with transferring the workload. If the DPM 180 is able to find a target set of servers for workload consolidation (element 907), scheduling operations for the transfer of the workload may be initiated (element 910), e.g., application instances may be migrated by sending commands or requests via the appropriate programmatic interfaces to one or more service managers 172 and/or PMEs 110. After the workload is transferred, the set of servers from which the workload was removed may be set to a low-power state (element 913). If no appropriate target set of servers is found in operations corresponding to element 907, the DPM 180 may resume searching for candidate source and target server sets for workload consolidation in the depicted embodiment. It is noted that at least in some embodiments, the source and target sets of servers may overlap—e.g., it may be possible to reduce overall power consumption by moving workload from one source server S1 to another source server S2. In one embodiment, DPMs at multiple data centers may collaborate to optimize overall power consumption—for example, some applications or workload may be migrated from one data center to another, i.e., for a given source set of servers at data center DC1, a target set of servers may be found at a different data center DC2.

Use Cases

The techniques described above, of implementing various techniques for datacenter level power optimization based on metrics collected from various components and devices of the datacenter, may be useful in a variety of different scenarios. For example, such techniques may be especially beneficial in environments in which datacenters contain heterogeneous collections of servers, e.g., due to inventory accumulated over the course of several years, and in which the workloads or applications supported vary substantially in their compute needs and I/O or memory needs. As power costs rise and/or as the environmental impact of high power utilization levels increases, these approaches may become even more valuable. As more control becomes possible over power consumption—e.g., as server architectures that support selective, programmable lowering of power to different components become more popular, and as more intelligence is built in to the power distribution and cooling infrastructures in data centers, the techniques described herein are likely to result in increased cost savings.

Illustrative Computer System

Figure 10:
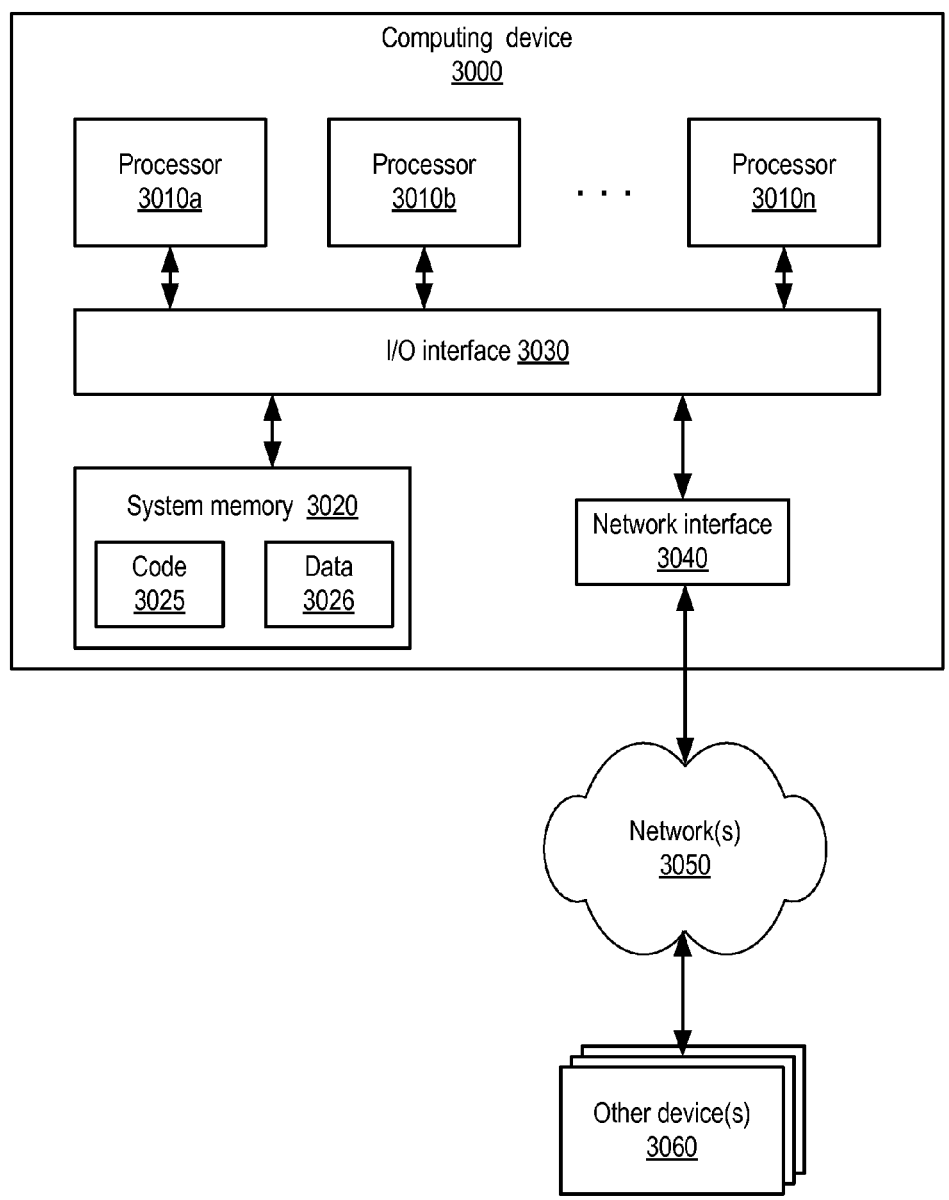
FIG. 10 is a block diagram illustrating an example computing device that may be used in at least some embodiments.

In at least some embodiments, a server that implements a portion or all of one or more of the technologies described herein, including the techniques to implement the various components of the DPM 180 and/or PMEs 110, may include a general-purpose computer system that includes or is configured to access one or more computer-accessible media. FIG. 10 illustrates such a general-purpose computing device 3000. In the illustrated embodiment, computing device 3000 includes one or more processors 3010 coupled to a system memory 3020 via an input/output (I/O) interface 3030. Computing device 3000 further includes a network interface 3040 coupled to I/O interface 3030.

In various embodiments, computing device 3000 may be a uniprocessor system including one processor 3010, or a multiprocessor system including several processors 3010 (e.g., two, four, eight, or another suitable number). Processors 3010 may be any suitable processors capable of executing instructions. For example, in various embodiments, processors 3010 may be general-purpose or embedded processors implementing any of a variety of instruction set architectures (ISAs), such as the x86, PowerPC, SPARC, or MIPS ISAs, or any other suitable ISA. In multiprocessor systems, each of processors 3010 may commonly, but not necessarily, implement the same ISA.

System memory 3020 may be configured to store instructions and data accessible by processor(s) 3010. In various embodiments, system memory 3020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are shown stored within system memory 3020 as code 3025 and data 3026.

In one embodiment, I/O interface 3030 may be configured to coordinate I/O traffic between processor 3010, system memory 3020, and any peripheral devices in the device, including network interface 3040 or other peripheral interfaces. In some embodiments, I/O interface 3030 may perform any necessary protocol, timing or other data transformations to convert data signals from one component (e.g., system memory 3020) into a format suitable for use by another component (e.g., processor 3010). In some embodiments, I/O interface 3030 may include support for devices attached through various types of peripheral buses, such as a variant of the Peripheral Component Interconnect (PCI) bus standard or the Universal Serial Bus (USB) standard, for example. In some embodiments, the function of I/O interface 3030 may be split into two or more separate components, such as a north bridge and a south bridge, for example. Also, in some embodiments some or all of the functionality of I/O interface 3030, such as an interface to system memory 3020, may be incorporated directly into processor 3010.

Network interface 3040 may be configured to allow data to be exchanged between computing device 3000 and other devices 3060 attached to a network or networks 3050, such as other computer systems or devices as illustrated in FIG. 1 through FIG. 9, for example. In various embodiments, network interface 3040 may support communication via any suitable wired or wireless general data networks, such as types of Ethernet network, for example. Additionally, network interface 3040 may support communication via telecommunications/telephony networks such as analog voice networks or digital fiber communications networks, via storage area networks such as Fibre Channel SANs, or via any other suitable type of network and/or protocol.

In some embodiments, system memory 3020 may be one embodiment of a computer-accessible medium configured to store program instructions and data as described above for FIG. 1 through FIG. 9 for implementing embodiments of the corresponding methods and apparatus. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computing device 3000 via I/O interface 3030. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computing device 3000 as system memory 3020 or another type of memory. Further, a computer-accessible medium may include transmission media or signals such as electrical, electromagnetic, or digital signals, conveyed via a communication medium such as a network and/or a wireless link, such as may be implemented via network interface 3040. Portions or all of multiple computing devices such as that illustrated in FIG. 10 may be used to implement the described functionality in various embodiments; for example, software components running on a variety of different devices and servers may collaborate to provide the functionality. In some embodiments, portions of the described functionality may be implemented using storage devices, network devices, or special-purpose computer systems, in addition to or instead of being implemented using general-purpose computer systems. The term "computing device", as used herein, refers to at least all these types of devices, and is not limited to these types of devices.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
one or more computing devices configured to:
collect, from a plurality of power management endpoints at a data center of a provider network, respective sets of metrics, wherein the data center comprises a plurality of servers, wherein the plurality of power management endpoints includes at least one power distribution unit (PDU) endpoint, at least one rack endpoint, and at least one server endpoint, and wherein a set of metrics collected from a particular server endpoint comprises an indication of power usage at a particular server of the plurality of servers and an indication of a particular application executing at the particular server;
store (a) respective location mappings for the plurality of servers of the data center, wherein a location mapping of the particular server comprises an indication of a rack in which the particular server is located and one or more power domains from which the particular server obtains power, (b) system profiles for the plurality of servers, and (c) workload profiles of one or more applications, including the particular application, targeted for execution at the data center, wherein each workload profile includes a respective indication of a corresponding resource consumption pattern associated with the respective application;
determine, based at least in part on an analysis of one or more metrics collected from one or more power management endpoints of the plurality of power management endpoints, to initiate a power optimization operation;
initiate, as part of the power optimization operation, at least one of: (a) a workload scheduling operation associated with the particular application, or (b) a power configuration operation associated with at least one power management endpoint of the plurality of power management endpoints;
classify, based at least in part on their respective system profiles, the plurality of servers into a plurality of capability categories, wherein a particular server is classified in a particular capability category based at least in part on a performance level of the particular server; and
schedule workload associated with the particular application on the particular server based at least in part on (a) a determination that the workload profile of the particular application corresponds to the particular capability category and (b) a determination that a power consumption profile of the particular server is in accordance with a power consumption goal.

2. The system as recited in claim 1, wherein the analysis of the one or more metrics indicates that, at the particular server, a probability of a thermal constraint being violated in response to additional workload exceeds a threshold value, and wherein the one or more computing devices are configured to initiate, as part of the power optimization operation, scheduling of additional workload associated with the particular application on a different server of the data center.

3. The system as recited in claim 1, wherein a particular rack of a plurality of racks at the data center is configured with a plurality of independently-controllable power domains, including a particular power domain from which power is provided to the particular server, wherein the analysis of the one or more metrics indicates that a power consumption level at the particular power domain is below a threshold value, and wherein the power optimization operation comprises (a) a configuration of at least the particular server in a low-power state and (b) a scheduling of additional workload associated with the particular application at a different server obtaining power from a different power domain of the plurality of independently-controllable power domains.

4. The system as recited in claim 1, wherein the system profile associated with the particular server includes (a) an indication of one or more processing elements of the particular server and (b) a power consumption profile of the particular server.

5. The system as recited in claim 4, wherein the one or more processing elements of the particular server comprise a first processing core with a first power consumption profile and a first performance level, and a different processing core with a different power consumption profile and a different performance level, wherein the first processing core and the different processing core share access to a memory module.

6. A method, comprising:
performing, by one or more computing devices:
collecting, from a plurality of power management endpoints at a data center, respective sets of metrics;
storing system profiles for a plurality of servers of the data center and workload profiles of one or more applications targeted for execution at the data center, wherein each workload profile includes a respective indication of a corresponding resource consumption pattern associated with the respective application;
determining, based at least in part on an analysis of one or more metrics collected from one or more power management endpoints of the plurality of power management endpoints, to initiate a power optimization operation;
initiating, as part of the power optimization operation, at least one of: (a) a workload scheduling operation associated with an application of the one or more applications or (b) a power configuration operation associated with at least one power management endpoint of the plurality of power management endpoints;
classifying, based at least in part on their respective system profiles, the plurality of servers into a plurality of capability categories, wherein a particular server is classified in a particular capability category based at least in part on a performance level of the particular server; and
scheduling workload associated with a particular application of the one or more applications on the particular server based at least in part on (a) a determination that the workload profile of the particular application corresponds to the particular capability category and (b) a determination that a power consumption profile of the particular server is in accordance with a power consumption goal.

7. The method as recited in claim 6, wherein the plurality of power management endpoints comprises at least one power distribution unit (PDU) endpoint, at least one rack endpoint, and at least one server endpoint.

8. The method as recited in claim 6, wherein said collecting comprises receiving, by a datacenter power manager, the respective sets of metrics in encrypted network messages transmitted in accordance with a monitoring protocol, wherein the monitoring protocol defines a schedule to be used by a particular power management endpoint of the plurality of power management endpoints to transmit metrics to the datacenter power manager.

9. The method as recited in claim 6, wherein the analysis of the one or more metrics indicates that, at a particular server of the data center, a probability of a thermal constraint being violated in response to additional workload exceeds a threshold value, and wherein the power optimization operation comprises scheduling additional workload associated with a particular application of the one or more applications on a different server of the data center.

10. The method as recited in claim 6, wherein the data center comprises a plurality of racks, further comprising performing, by the one or more computing devices:
configuring a particular rack of a plurality of racks at the data center with a plurality of independently-controllable power domains.

11. The method as recited in claim 10, wherein the analysis of the one or more metrics indicates that a power consumption level at a particular power domain of the plurality of independently-controllable power domains is below a threshold value, and wherein the power optimization operation comprises (a) configuring at least one server obtaining power from the particular power domain in a low-power state and (b) scheduling additional workload associated with a particular application of the one or more applications to a different server obtaining power from a different power domain of the plurality of independently-controllable power domains.

12. The method as recited in claim 6, wherein the system profile associated with a particular server of the data center includes (a) an indication of one or more processing elements of the particular server and (b) a power consumption profile of the particular server.

13. The method as recited in claim 12, wherein the one or more processing elements of the particular server comprise a first processing core with a first power consumption profile and a first performance level, and a different processing core with a different power consumption profile and a different performance level, wherein the first processing core and the different processing core share access to a memory module.

14. The method as recited in claim 6, further comprising performing, by the one or more computing devices:
identifying, based at least in part on one or more sets of collected metrics, a source set of one or more servers of the data center from which workload is to be migrated to achieve a power consumption goal;
initiating a migration of the workload to a target set of one or more servers; and
configuring the source set of one or more servers to a low-power state in accordance with the power consumption goal.

15. The method as recited in claim 14, wherein the target set of one or more servers is located at a different data center.

16. The method as recited in claim 6, wherein the power configuration operation comprises a configuration of a component of a cooling infrastructure of the data center.

17. A non-transitory computer-accessible storage medium storing program instructions that when executed on one or more processors:
  collect, from a plurality of power management endpoints at a data center, respective sets of metrics;
  store system profiles of a plurality of servers of the data center and workload profiles of one or more applications, wherein each workload profile includes a respective indication of a corresponding resource consumption pattern associated with the respective application;
  initiate, based at least in part on an analysis of one or more metrics collected from one or more power management endpoints of the plurality of power management endpoint, at least one of: (a) a workload scheduling operation associated with an application of the one or more applications or (b) a power configuration operation associated with at least one server of the plurality of servers;
  classify, based at least in part on their respective system profiles, the plurality of servers into a plurality of capability categories, wherein a particular server is classified in a particular capability category based at least in part on a performance level of the particular server; and
  schedule workload associated with a particular application of the one or more applications on a particular server based at least in part on (a) a determination that the workload profile of the particular application corresponds to the particular capability category and (b) a determination that a power consumption profile of the particular server is in accordance with a power consumption goal.

18. The non-transitory computer-accessible storage medium as recited in claim 17, wherein the plurality of power management endpoints comprises at least one power distribution unit (PDU) endpoint, at least one rack endpoint, and at least one server endpoint.

19. The non-transitory computer-accessible storage medium as recited in claim 17, wherein the analysis of the one or more metrics indicates that, at a particular server of the data center, a probability of a thermal constraint being violated in response to additional workload exceeds a threshold value, and wherein the workload scheduling operation comprises scheduling additional workload associated with a particular application of the one or more applications on a different server of the data center.

20. The non-transitory computer-accessible storage medium as recited in claim 17, wherein the instructions when executed on the one or more processors initiate at least one of: (a) the workload scheduling operation or (b) the power configuration operation based at least in part on an analysis of a historical record indicative of power usage.

21. The non-transitory computer-accessible storage medium as recited in claim 17, wherein the analysis of the one or more metrics indicates that a power consumption level at a particular power domain of a plurality of independently-controllable power domains at a rack of the data center is below a threshold value, and wherein the instructions when executed at the one or more processors:
  initiate a configuration of at least one server obtaining power from the particular power domain in a low-power state; and
  schedule additional workload associated with a particular application of the one or more applications to a different server obtaining power from a different power domain of the plurality of independently-controllable power domains.

22. The non-transitory computer-accessible storage medium as recited in claim 17, wherein the system profile associated with a particular server of the data center includes (a) an indication of one or more processing elements of the particular server and (b) a power consumption profile of the particular server, wherein the instructions when executed on the one or more processors:
  schedule workload associated with a particular application of the one or more applications on the particular server based at least in part on (a) a determination that the workload profile of the particular application corresponds to the particular capability category and (b) a determination that the power consumption profile of the particular server is in accordance with a power consumption goal.

23. The non-transitory computer-accessible storage medium as recited in claim 22, wherein the one or more processing elements of the particular server comprise a first processing core with a first power consumption profile, and a different processing core with a different power consumption profile.

24. The non-transitory computer-accessible storage medium as recited in claim 17, wherein the instructions when executed on the one or more processors:
  identify, based at least in part on one or more sets of collected metrics, a source set of one or more servers of the data center from which one or more application instances are to be migrated to achieve a power consumption goal;
  initiate a migration of the one or more application instances to a target set of one or more servers; and
  configure the source set of one or more servers to a low-power state in accordance with the power consumption goal.

* * * * *